(12) United States Patent
Sunahara et al.

(10) Patent No.: US 6,428,392 B1
(45) Date of Patent: Aug. 6, 2002

(54) ABRASIVE

(75) Inventors: Kazuo Sunahara; Sumihisa Yamaguchi, both of Kanagawa (JP)

(73) Assignee: Seimi Chemical Co., Ltd., Chigasaki (JP)

( * ) Notice: Subject to any disclaimer, the term of this patent is extended or adjusted under 35 U.S.C. 154(b) by 0 days.

(21) Appl. No.: 09/532,863

(22) Filed: Mar. 22, 2000

(30) Foreign Application Priority Data

Mar. 23, 1999 (JP) ............................................ 11-077025

(51) Int. Cl.$^7$ ................................................. B24B 1/00
(52) U.S. Cl. ............................. 451/36; 451/41; 51/307; 51/308; 51/309
(58) Field of Search ............................. 451/41, 36, 37; 51/307, 308, 309

(56) References Cited

U.S. PATENT DOCUMENTS

| | | | | | |
|---|---|---|---|---|---|
| 5,264,010 A | * | 11/1993 | Brancaleoni et al. | ......... | 51/308 |
| 5,733,819 A | * | 3/1998 | Kodama et al. | ............ | 438/692 |
| 5,861,055 A | * | 1/1999 | Allman et al. | .................. | 106/3 |
| 5,958,794 A | * | 9/1999 | Bruxvoort et al. | ........... | 438/692 |
| 5,972,124 A | * | 10/1999 | Sethuraman et al. | ............ | 134/7 |
| 5,997,620 A | * | 12/1999 | Kodama et al. | ................ | 106/3 |
| 6,068,769 A | * | 5/2000 | Lio et al. | ..................... | 210/315 |
| 6,117,220 A | * | 9/2000 | Kodama et al. | ................ | 106/3 |
| 6,120,571 A | * | 9/2000 | Aihara et al. | .................. | 51/309 |
| 6,139,763 A | * | 10/2000 | Ina et al. | ....................... | 216/89 |

FOREIGN PATENT DOCUMENTS

JP     10-183103     7/1998

* cited by examiner

Primary Examiner—M. Rachuba
(74) Attorney, Agent, or Firm—Oblon, Spivak, McClelland, Maier & Neustadt, P.C.

(57) ABSTRACT

An abrasive comprising at least the following components (A) and (B):

(A) cerium-containing abrasive grains having an average particle size of from 0.5 to 5.0 $\mu$m; and (B) particles having an average particle size of from 0.01 to 0.3 $\mu$m, which are particles of at least one member selected from the group consisting of aluminum oxide, silicon dioxide, zirconium oxide, titanium oxide, silicon nitride and manganese oxide.

32 Claims, No Drawings

ABRASIVE

BACKGROUND OF THE INVENTION

1. Field of the Invention

The present invention relates to a cerium-containing abrasive suitable for precisely polishing a glass sheet or a semiconductor substrate.

2. Discussion of Background

Heretofore, a cerium type abrasive has been widely used for polishing the surface of glass such as glass for lenses, optical glass, sheet glass, bulb glass, a glass substrate for magnetic disk, glass for photomask, a glass substrate for TFT, and it is known to exhibit a very high polishing rate.

Further, a cerium type abrasive has recently been used not only for glass but also as an abrasive (an abrasive slurry) in a chemical mechanical polishing (hereinafter referred to as CMP) method which is a polishing technique for ultraprecise planarization of an insulating layer and/or a metal layer formed on a semiconductor substrate in the process for producing a LSI device having a multilayered wiring structure.

However, in an application where an extremely high level of flatness is required like precise polishing for mirror finish of a glass surface or CMP of a semiconductor substrate, it is difficult to realize a sufficient polishing rate and a high level of flatness solely by means of a conventional cerium type abrasive.

Accordingly, it has been proposed to carry out a plurality of polishing steps in combination with a polishing step by means of a colloidal silica abrasive, but there has been a problem such that the process steps and installation tend to be complex, as extra installations for polishing steps will be required, and the preparation time for switching will be wasted.

Further, in the case of a glass sheet produced by a so-called float process wherein molten glass is permitted to continuously flow and advance while floating on a molten metal bath surface, it has been found by our study that on such a glass surface, a layer of the metal of the metal bath, such as tin or a tin compound, is formed, and it is not easy to sufficiently remove this metal layer solely by means of a conventional cerium type abrasive.

Accordingly, it is desired to develop an abrasive which has a higher ability to polish a glass surface and which is suitable also for planarization of a semiconductor substrate.

SUMMARY OF THE INVENTION

It is an object of the present invention to provide an abrasive having both a high polishing rate and an excellent planarization ability in polishing a glass surface and in planarization of a semiconductor substrate.

(1) The present invention provides an abrasive comprising at least the following components (A) and (B):

(A) cerium-containing abrasive grains having an average particle size of from 0.5 to 5.0 μm; and (B) particles having an average particle size of from 0.01 to 0.3 μm, which are particles of at least one member selected from the group consisting of aluminum oxide, silicon dioxide, zirconium oxide, titanium oxide, silicon nitride and manganese oxide.

(2) Further, the present invention provides a polishing method for a glass surface, which comprises polishing the glass surface with the above abrasive.

(3) Furthermore, the present invention provides a planarization method for a semiconductor substrate, which comprises polishing an insulating layer and/or a metal layer formed on a semiconductor substrate, with the above-mentioned abrasive.

Further embodiments of the present invention will be made apparent from the following description.

DETAILED DESCRIPTION OF THE PREFERRED EMBODIMENTS

The abrasive of the present invention comprises at least the following components (A) and (B):

(A) cerium-containing abrasive grains having an average particle size of from 0.5 to 5.0 μm (hereinafter referred to also as component (A)); and (B) particles of at least one member selected from the group consisting of aluminum oxide, silicon dioxide, zirconium oxide, titanium oxide, silicon nitride and manganese oxide, which has an average particle size of from 0.01 to 0.3 μm (hereinafter referred to also as component (B)).

Here, the cerium-containing abrasive grains are abrasive grains comprising cerium oxide and other rare earth oxide as the main components, which are so-called a cerium type abrasive to be used for polishing e.g. glass. Such abrasive grains are obtainable mainly from a rare earth ore such as a rare earth carbonate via a step of e.g. calcination.

The average particle size of the cerium-containing abrasive grains (component (A)) in the present invention is from 0.5 to 5.0 μm in order to satisfy both the high polishing power and reduction of scratching. If the particle size is substantially larger than this range, scratching will increase, and if it is substantially smaller, the polishing power will deteriorate. The cerium-containing abrasive grains preferably contain cerium oxide (ceria, $CeO_2$) in an amount of at least 50 mass %, preferably at least 60 mass %, more preferably at least 80 mass %, from the viewpoint of the polishing power and easiness in its production. Especially when the abrasive is to be used for planarization of a semiconductor substrate, cerium oxide is preferably at least 98 mass %, more preferably at least 99.8 mass %, since it is difficult to remove any remaining impurities after polishing. The cerium-containing abrasive grains may be in the form of a powder or a sol. However, from the viewpoint of the handling efficiency, the powder form is preferred.

In the present invention, for the average particle size, a particle size distribution on the basis of mass is obtained to prepare a cumulative curve for a total mass of 100%, and a particle size at a point where the cumulative curve becomes 50%, is taken as the average particle size. This average particle size may be referred to also as a mass basis cumulative 50% particle size (see e.g. Chemical Engineering Handbook, 5th edition, compiled by Chemical Engineering Association, p. 220–221).

The measurement of such an average particle size is carried out, for example, by using an instrument such as Microtrack HRAX-100, manufactured by Nikkiso K.K., in such a manner that abrasive grains are subjected to ultrasonic wave treatment in a medium such as water, and the particle size distribution is measured when the dispersion state of the abrasive grains has been stabilized.

The particle size of cerium oxide can be adjusted also by the calcination temperature when the low material such as a rare earth carbonate is calcined in an electric furnace. Usually, the higher the calcination temperature, the larger the particle size. Accordingly, a suitable calcination temperature is selected. Further, it is also possible to selectively obtain only particles having a certain particle size by e.g. classification after the calcination.

The particles of component (B) in the abrasive of the present invention are characterized in that they are basically hard particles having a hardness higher than component (A) and having a particle size substantially smaller than component (A). Specifically, their average particle size is usually from 0.01 to 0.3 μm in order to reduce scratching. Particularly for polishing a glass surface, the average particle size is preferably from 0.1 to 0.3 μm. If the particle size is too small, no adequate effect of addition of component (B) tends to be obtained, and if the particle size is too large, the hardness tends to be high, and scratching is likely to occur.

The type of the particles constituting component (B) is suitably selected depending upon the object to be polished. However, from the viewpoint of the cost and the polishing power, it is preferably selected from aluminum oxide (alumina, $Al_2O_3$), silicon dioxide (silica, $SiO_2$), zirconium oxide (zirconia, $ZrO_2$), titanium oxide (titania, $TiO_2$), silicon nitride ($Si_3N_4$) and manganese oxide ($MnO_2$, $Mn_2O_3$, $Mn_3O_4$, etc). Among them, alumina, zirconia or silica is particularly preferred.

For polishing a glass surface, $Al_2O_3$ is particularly preferred from the viewpoint of the polishing power. To avoid scratching, it is particularly preferred to suitably select a-alumina having a higher hardness or γ-alumina having a fine particle size. As alumina particles, those having natures represented by the following (1) and (2) and their mixtures are, for example, more preferred from the viewpoint of easy production or availability:

(1) Alumina particles having an average particle size of from 0.1 to 0.3 μm and a crystal form of α-alumina; and (2) Alumina particles having an average particle size of from 0.01 to 0.15 μm and having a crystal form of γalumina.

In the abrasive of the present invention, the mass ratio of component (A) to component (B) is preferably from 1:0.001 to 1:0.3, more preferably from 1:0.005 to 1:0.2, from the viewpoint of the polishing power.

The method of use of the abrasive of the present invention is not particularly limited. However, it is advisable to use it in the form of a slurry having a solid content of from 0.1 t 30 mass %, preferably from 1 to 15 mass % (hereinafter referred to also as an abrasive slurry) by thoroughly dispersing it in water by an agitation mixing machine or a homogenizer. Further, to such a slurry, an additive such as a dispersant, a thickener, an oxidizing agent or a pH-regulating agent, may be suitably incorporated, as the case requires.

In such a case, it is also possible to prepare an abrasive slurry from a powder of $CeO_2$ as component (A) and a dispersion having component (B) such as alumina dispersed in a medium.

Polishing by means of such an abrasive slurry, can be carried out in accordance with a conventional method. For example, polishing of a glass surface or planarization of a semiconductor substrate may be carried out while supplying the abrasive slurry to a polishing section in an apparatus comprising a polishing head located above and provided with a driving means to hold and rotate an object to be polished such as a glass sheet or a semiconductor substrate, and a rotational platen located below to face the polishing head and having a polishing pad attached thereto.

The abrasive of the present invention is useful for polishing a glass surface and is used for e.g. glass for lenses, optical glass, sheet glass, bulb glass, glass magnetic disk, glass for photomask, or a glass substrate for TFT. The abrasive of the present invention has an adequate polishing power especially against a glass prepared by a float process and having a coating layer or blocks of e.g. tin oxide attached on the surface.

Further, the abrasive of the present invention is useful also for a planarization method for a semiconductor substrate which comprises polishing an insulating layer and/or a metal layer formed on a semiconductor substrate. When the abrasive is applied to CMP, the polishing powers against the insulating layer and the metal layer may, respectively, be adjusted to be optimum by suitably selecting the type, particle size and content of component (B).

The abrasive of the present invention comprising at least component (A) and component (B), has a high polishing power which can not be obtained by cerium alone, as will be shown in the Examples given hereinafter, and it can effectively be used for polishing a glass on which tin oxide or the like remains, without bringing about scratching.

At present, the detailed polishing mechanism by the abrasive of the present invention is not clearly understood, but is considered to be as follows. Namely, with the conventional cerium-containing abrasive grains (component (A)) only, the polishing power is weak or the planarization ability is low. Whereas, when a small amount of particles (component (B)) having a particle size smaller and a hardness higher than the cerium particles and having a different type of polishing action, are incorporated to such cerium-containing abrasive grains, the two components act on the surface to be polished to provide the respective merits during the polishing process, whereby the polishing power and the planarization ability which can not be obtained by the cerium-containing abrasive grains (component (A)) only, can be complemented by component (B), and the required performance can be attained by a single (one step) polishing operation.

Further, it is considered that by properly selecting component (B) for its type, particle size and crystal form and incorporating it in a specific amount to component (A), it is possible to maintain a high polishing power against any glass or semiconductor substrate to be polished, without bringing about scratching.

Thus, a plurality of polishing steps which used to be necessary since the polishing power was inadequate in the prior art, will be unnecessary. The present invention thus provides substantial merits in view of the cost, the operation efficiency and the installation.

Further, a glass produced by a float process has a tin or tin compound layer, such as tin oxide, formed on its surface, and it has been difficult to remove such a layer by a conventional cerium type abrasive only. Whereas, as mentioned above, component (B) such as alumina in the abrasive of the present invention has a proper polishing power against such a layer, whereby it is possible to remove the layer. Thus, the abrasive of the present invention is particularly useful for polishing the surface of a glass produced by a float process.

Now, the present invention will be described in further detail with reference to Examples. However, it should be understood that the present invention is by no means restricted to such specific Examples. Examples 1 to 10, 12 to 24, 26 to 35 and 37 to 49 are Working Examples of the present invention, and Examples 11, 25, 36 and 50 are Comparative Examples. In the following description, "%" means "mass %".

(I) Preparation of an Abrasive Slurry.

EXAMPLE 1

(I) Rare earth carbonate produced in China, having a total rare earth oxide (TREO) content of 41% and a cerium oxide content in TREO of 60%, was suspended in water and pulverized by a stirring mill for wet medium. After drying, it was calcined in an electric furnace at 900° C. for 5 hours. The calcined product was pulverized and classified to obtain cerium oxide powder having an average particle size of 1.6 μm (component (A)). To the obtained cerium oxide powder, α-alumina particles having an average article size of 0.12 μm (component (B)) was mixed in a mass ratio of 1% to the cerium oxide. Then, water was added thereto to obtain a 10% slurry.

EXAMPLE 2

A slurry was prepared in the same manner as in Example 1 except that the average particle size of the α-alumina particles as component (B) was changed to 0.19 μm.

EXAMPLE 3

A slurry was prepared in the same manner as in Example 1 except that the average particle size of the α-alumina particles as component (B) was changed to 0.28 μm

EXAMPLES 4 to 6

Slurries were prepared in the same manner as in Examples 1 to 3 except that the α-alumina particles in Examples 1 to 3 as component (B) were respectively mixed in a mass ratio of 10% to the cerium oxide. They were respectively designated as Examples 4, 5 and 6.

EXAMPLE 7

A slurry was prepared in the same manner as in Example 1 except that the α-alumina particles as component (B) were changed to γ-alumina particles having an average particle size of 0.012 μm.

EXAMPLE 8

A slurry was prepared in the same manner as in Example 1 except that the α-alumina particles as component (B) were changed to γ-alumina particles having an average particle size of 0.019 μm.

EXAMPLES 9 and 10

Slurries were prepared in the same manner as in Examples 7 and 8 except that the γ-alumina particles in Examples 7 and 8 as component (B) were mixed in a mass ratio of 10% to the cerium oxide. They were respectively designated as Examples 9 and 10.

EXAMPLE 11

A cerium oxide powder (component (A)) was obtained in the same manner as in Example 1. To the obtained cerium oxide powder, water was added to obtain a 10% slurry. Namely, this abrasive slurry was composed solely of component (A) and did not contain component (B).

EXAMPLE 12

A slurry was prepared in the same manner as in Example 1 except that the calcination condition in Example 1 was changed from calcination in an electric furnace at 900° C. (usual calcination temperature) for 5 hours to calcination in an electric furnace at 700° C. (low temperature calcination) for 4 hours. Here, the average particle size of the cerium oxide powder obtained by the calcination (component (A)) was 0.8 μm.

EXAMPLE 13

A slurry was prepared in the same manner as in Example 12 except that the average particle size of the α-alumina particles as component (B) was changed to 0.19

EXAMPLE 14

A slurry was prepared in the same manner as in Example 12 except that the average particle size of the α-alumina particles as component (B) was changed to 0.28 μm.

EXAMPLES 15 to 17

Slurries were prepared in the same manner as in Examples 12 to 14 except that the α-alumina particles in Examples 12 to 14 as component (B) were mixed in a mass ratio of 10% to the cerium oxide. They were respectively designated as Examples 15, 16 and 17.

EXAMPLE 18

A slurry was prepared in the same manner as in Example 12 except that the α-alumina particles as component (B) were changed to γ-alumina particles having an average particle size of 0.012 μm.

EXAMPLE 19

A slurry was prepared in the same manner as in Example 12 except that the α-alumina particles as component (B) were changed to γ-alumina particles having an average particle size of 0.019 μm.

EXAMPLES 20 and 21

Slurries were prepared in the same manner as in Examples 18 and 19 except that the γ-alumina particles in Examples 18 and 19 as component (B) were mixed in a mass ratio of 10% to the cerium oxide. They were respectively designated as Examples 20 and 21.

EXAMPLE 22

A slurry was prepared in the same manner as in Example 12 except that the γ-alumina particles as component (B) were changed to silica ($SiO_2$) particles having an average particle size of 0.18 μm.

EXAMPLE 23

A slurry was prepared in the same manner as in Example 12 except that the γ-alumina particles as component (B) were changed to zirconia ($ZrO_2$) particles having an average particle size of 0.20 μm.

EXAMPLE 24

A slurry was prepared in the same manner as in Example 12 except that the α-alumina particles as component (B) were changed to manganese dioxide ($MnO_2$) particles having an average particle size of 0.20 μm.

EXAMPLE 25

A cerium oxide powder (component (A)) was obtained in the same manner as in Example 12. To the obtained cerium oxide powder, water was added to obtain a 10% slurry. Namely, this abrasive slurry was composed solely of component (A) and did not contain component (B).

(II) Polishing Test of Sheet Glass

With the above-mentioned respective slurries of Examples 1 to 22, polishing was carried out by the following method, and the mass reduction by the polishing (i.e. the difference in mass as between before and after the polishing) was measured. With respect to the slurries of Examples 1 to 10, the polishing power was represented by a relative value calculated on the basis that the mass reduction by polishing with the slurry of Example 11 having no component (B) incorporated, was rated to be 100. The results are shown in Table 1.

Likewise, with respect to the slurries of Examples 12 to 24, the polishing power was represented by a relative value calculated on the basis that the mass reduction by the polishing with the slurry of Example 25 having no component (B) incorporated, was rated to be 100. The results are shown in Table 2. No scratching was observed in polishing with any one of the slurries of Examples 1 to 25.

Polishing method

| Polishing machine used: | 6B rubbing machine |
|---|---|
| Material to be polished: | Blue sheet glass having a diameter of 50 mm |
| Polishing pressure: | 9.0 kPa |
| Rotational speed of platen: | 40 rpm |
| Polishing time: | 45 minutes |

TABLE 1

|  | Polishing power |
|---|---|
| Example 1 | 118 |
| Example 2 | 120 |
| Example 3 | 123 |
| Example 4 | 127 |
| Example 5 | 130 |
| Example 6 | 132 |
| Example 7 | 108 |
| Example 8 | 111 |
| Example 9 | 114 |
| Example 10 | 118 |
| Example 11 | 100 |

TABLE 2

|  | Polishing power |
|---|---|
| Example 12 | 113 |
| Example 13 | 116 |
| Example 14 | 118 |
| Example 15 | 122 |
| Example 16 | 124 |
| Example 17 | 128 |
| Example 18 | 104 |
| Example 19 | 108 |
| Example 20 | 109 |
| Example 21 | 113 |
| Example 22 | 105 |
| Example 23 | 121 |
| Example 24 | 113 |
| Example 25 | 100 |

(III) Polishing of a Glass Sheet Having a Crystallizable Sn-containing Layer on Its Surface With the respective slurries of Example 2 (containing components (A) and (B)) and Example 11 (containing component (A) only), polishing was carried out by the following polishing method, and the number of sheets from which crystallizable Sn was removed by polishing, was counted. The results were such that with the slurry of Example 2, out of 10 sheets, 9 sheets had Sn removed, whereas, with the slurry of Example 11, out of 10 sheets, only one sheet had Sn removed.

Polishing method

| Polishing machine used: | 6B rubbing machine |
|---|---|
| Material to be polished: | Glass sheet having a diameter of 50 mm and having a crystallizable Sn-containing layer on its surface |
| Polishing pressure: | 9.0 kPa |
| Rotational speed of platen: | 60 rpm |
| Polishing time: | 10 minutes |

(IV) Preparation of an abrasive slurry

EXAMPLE 26

High purity rare earth carbonate ($CeO_2$ purity: 99.9%) was suspended in water and pulverized by a stirring mill for wet medium. After drying, it was calcined in an electric furnace at 900° C. for 5 hours. The calcined product was pulverized and then classified to obtain a cerium oxide powder having an average particle size of 0.61 μm (component (A)). To the obtained cerium oxide powder ($CeO_2$ purity: 99.9%), α-alumina particles having an average particle size of 0.12 μm (component (B)) were mixed in an amount of 1 mass % to the cerium oxide, and then water was added to obtain a 10% slurry.

EXAMPLE 27

A slurry was prepared in the same manner as in Example 26 except that the average particle size of the α-alumina particles as component (B) was changed to 0.19 μm.

EXAMPLE 28

A slurry was prepared in the same manner as in Example 26 except that the average particle size of the α-alumina particles as component (B) was changed to 0.28 μm.

EXAMPLES 29 to 31

Slurries were prepared in the same manner as in Examples 26 to 28 except that the α-alumina particles in Examples 26 to 28 as component (B) were mixed in an amount of 10% to the cerium oxide. They were respectively designated as Examples 29, 30 and 31.

EXAMPLE 32

A slurry was prepared in the same manner as in Example 26 except that the α-alumina particles as component (B) were changed to γ-alumina particles having an average particle size of 0.012 μm.

EXAMPLE 33

A slurry was prepared in the same manner as in Example 26 except that the α-alumina particles as component (B) were changed to γ-alumina particles having an average particle size of 0.019 μm.

EXAMPLES 34 and 35

Slurries were prepared in the same manner as in Examples 32 and 33 except that the γ-alumina particles as component (B) were mixed in an amount of 10% to the cerium oxide. They were respectively designated as Examples 34 and 35.

EXAMPLE 36

In the same manner as in Example 26, a cerium oxide powder (component (A)) was obtained. To the obtained cerium oxide powder, water was added to obtain a 10% slurry. Namely, this abrasive slurry was composed solely of component (A) and did not contain component (B).

EXAMPLE 37

An abrasive slurry was obtained in the same manner as in Example 26, except that the calcination condition was changed from calcination in an electric furnace at 900° C. (usual calcination temperature) for 5 hours to calcination in an electric furnace at 700° C. (low temperature calcination) for 4 hours. Here, the average particle size of the cerium oxide powder (component (A)) obtained by the calcination was 0.52 μm.

EXAMPLE 38

A slurry was prepared in the same manner as in Example 37 except that the average particle size of the α-alumina particles as component (B) was changed to 0.19 μm.

EXAMPLE 39

A slurry was prepared in the same manner as in Example 37 except that the average particle size of the α-alumina particles as component (B) was changed to 0.28 μm.

EXAMPLES 40 to 42

Slurries were prepared in the same manner as in Examples 37 to 39 except that the α-alumina particles as component (B) were mixed in an amount of 10% to the cerium oxide. They were respectively designated as Examples 40, 41 and 42.

EXAMPLE 43

A slurry was prepared in the same manner as in Example 37 except that the α-alumina particles as component (B) were changed to γ-alumina particles having an average particle size of 0.012 μm.

EXAMPLE 44

A slurry was prepared in the same manner as in Example 37 except that the α-alumina particles as component (B) were changed to γ-alumina particles having an average particle size of 0.019 μm.

EXAMPLES 45 and 46

Slurries were prepared in the same manner as in Examples 43 and 44 except that the α-alumina particles as component (B) were mixed in an amount of 10% to the cerium oxide. They were respectively designated as Examples 45 and 46.

EXAMPLE 47

A slurry was prepared in the same manner as in Example 37 except that the α-alumina particles as component (B) were changed to silica ($SiO_2$) particles having an average particle size of 0.18 μm.

EXAMPLE 48

A slurry was prepared in the same manner as in Example 37 except that the α-alumina particles as component (B) were changed to zirconia ($ZrO_2$) particles having an average particle size of 0.20 μm.

EXAMPLE 49

A slurry was prepared in the same manner as in Example 37 except that the α-alumina particles as component (B) were changed to manganese dioxide ($MnO_2$) particles having an average particle size of 0.20 μm.

EXAMPLE 50

In the same manner as in Example 37, a cerium oxide powder (component (A)) was obtained. To the obtained cerium oxide powder, water was added to obtain a 10% slurry. Namely, this abrasive slurry was composed solely of component (A) and did not contain component (B).

(V) Polishing Test of a Si Wafer Having $SiO_2$ Attached

With the respective slurries of the above Examples 26 to 50, polishing was carried out by the following polishing method, and the mass reduction by polishing (i.e. the difference in mass as between before and after the polishing) was measured. With respect to the slurries of Examples 26 to 35, the polishing power was represented by a relative value calculated on the basis that the mass reduction by polishing with the slurry of Example 36 having no component (B) incorporated, was rated to be 100. The results are shown in Table 3.

Likewise, with respect to Examples 37 to 49, the polishing power was represented by a relative value calculated on the basis that the mass reduction by polishing with the slurry of Example 50 having no component (B) incorporated, was rated to be 100. The results are shown in Table 4. With any one of slurries of Examples 26 to 50, no scratching was observed.

Polishing method

| | |
|---|---|
| Polishing machine used: | CMP machine (model: 6EC STRASBAUGH CO.) |
| Material to be polished: | 8 inch Si wafer having a $SiO_2$ insulating layer attached |
| Polishing pressure: | 29.4 kPa |
| Rotational speed of platen: | 60 rpm |
| Polishing time: | 1 minute |

TABLE 3

| | Polishing power |
|---|---|
| Example 26 | 113 |
| Example 27 | 118 |
| Example 28 | 120 |
| Example 29 | 120 |
| Example 30 | 125 |
| Example 31 | 128 |
| Example 32 | 105 |
| Example 33 | 109 |
| Example 34 | 110 |
| Example 35 | 115 |
| Example 36 | 100 |

TABLE 4

| | Polishing power |
|---|---|
| Example 37 | 115 |
| Example 38 | 119 |
| Example 39 | 122 |
| Example 40 | 122 |
| Example 41 | 125 |
| Example 42 | 129 |
| Example 43 | 103 |
| Example 44 | 108 |
| Example 45 | 110 |
| Example 46 | 112 |

TABLE 4-continued

| | Polishing power |
|---|---|
| Example 47 | 103 |
| Example 48 | 112 |
| Example 49 | 110 |
| Example 50 | 100 |

As is evident from the results of the foregoing Examples and Tables 1 to 4, the following conclusions may be led.

① It has been confirmed that with a cerium-containing abrasive, the polishing power was improved in each case by incorporating component (B), as compared with a case made solely of component (A) (polishing power=100). Further, no scratching was observed even when the polishing power was improved.

② Further, with respect to polish of glass on which tin oxide or the like remained, such a tin metal layer or the like on the surface could not substantially be removed by policing with cerium oxide alone as conventional component (A). Whereas, by an addition of a small amount of alumina or the like having a specific particle size as component (B), it was made possible to substantially remove it. Thus, the adhesive of the present invention comprising component (A) and component (B) has been confirmed to be useful also for such an application.

③ Furthermore, also with respect to planarization of a semiconductor substrate having an insulating layer such as $SiO_2$ formed thereon, the polishing rate was not sufficiently high by polishing with cerium oxide alone as conventional component (A). Whereas, by an addition of a small amount of alumina or the like having a specific particle size as component (B), it was possible to remarkably increase the polishing rate without bringing about scratching. Thus, the abrasive of the present invention comprising component (A) and component (B) has been confirmed to be useful also for planarization of a semiconductor substrate.

④ Further, as shown in the Examples, it is possible to adjust the polishing power to the optimum level without bringing about scratching to the material to be polished, by adjusting the type, particle size, crystal form and amount of particles incorporated.

As described in the foregoing, the abrasive of the present invention is an abrasive having an excellent polishing power, which is free from bringing about scratching during polishing, and it is useful particularly for polishing a glass surface and for planarization (CMP) of a semiconductor substrate.

What is claimed is:

1. An abrasive comprising at least the following components (A) and (B):
    (A) cerium-containing abrasive grains having an average particle size of from 0.5 to 5.0 μm; and
    (B) particles having an average particle size of from 0.01 to 0.3 μm, which are particles of at least one member selected from the group consisting of aluminum oxide, silicon dioxide, zirconium oxide, titanium oxide, silicon nitride and manganese oxide,
        wherein component (A) is abrasive grains containing $CeO_2$ in an amount of more than 50% of the total mass.

2. The abrasive according to claim 1, wherein components (A) and (B) are contained in a mass ratio of from 1:0.001 to 1:0.3.

3. An abrasive comprising at least the following components (A) and (B);
    (A) cerium-containing abrasive grains having an average particle size of from 0.5 to 5.0 μm; and
    (B) particles having an average particle size of from 0.01 to 0.3 μm, which are particles of aluminum oxide.

4. The abrasive according to claim 3, wherein the crystal form of the particles of aluminum oxide is α-alumina or γ-alumina.

5. The abrasive according to claim 3, wherein the particles of aluminum oxide have an average particle size of from 0.1 to 0.3 μm, and the crystal form thereof is α-alumina.

6. The abrasive according to claim 3, wherein the particles of aluminum oxide have an average particle size of from 0.01 to 0.15 μm, and the crystal form thereof is γ-alumina.

7. An abrasive slurry having the abrasive as defined in claim 1 suspended in water to form a slurry.

8. The abrasive slurry according to claim 7, which is obtained by mixing component (A) in a powder form and a dispersion having component (B) dispersed in a medium.

9. A polishing method for a glass surface, which comprises polishing the glass surface with an abrasive comprising at least the following components (A) and (B):
    (A) cerium-containing abrasive grains having an average particle size of from 0.5 to 5.0 μm; and
    (B) particles having an average particle size of from 0.01 to 0.3 μm, which are particles of at least one member selected from the group consisting of aluminum oxide, silicon dioxide, zirconium oxide, titanium oxide, silicon nitride and manganese oxide, wherein component (A) is abrasive grains containing $CeO_2$ in an amount of more than 50% of the total mass.

10. The polishing method according to claim 9, wherein the glass surface has a metal attached thereon.

11. The polishing method according to claim 9, wherein components (A) and (B) are contained in a mass ratio of from 1:0.001 to 1:0.3.

12. A polishing method for a glass surface, which comprises polishing the glass surface with an abrasive comprising at least the following components (A) and (B):
    (A) cerium-containing abrasive grains having an average particle size of from 0.5 to 5.0 μm; and
    (B) particles having an average particle size of from 0.01 to 0.3 μm, which are particles of aluminum oxide, the crystal form of which is α-alumina or γ-alumina.

13. The polishing method according to claim 9, wherein the abrasive is used as suspended in water in the form of a slurry.

14. A polishing method for a semiconductor substrate, which comprises polishing an insulating layer and/or a metal layer formed on a semiconductor substrate, with a cerium-containing abrasive comprising at least the following components (A) and (B):
    (A) cerium-containing abrasive grains having an average particle size of from 0.5 to 5.0 μm; and
    (B) particles having an average particle size of from 0.01 to 0.3 μm, which are particles of at least one member selected from the group consisting of aluminum oxide, silicon dioxide, zirconium oxide, titanium oxide, silicon nitride and manganese oxide, wherein component (A) is abrasive grains containing $CeO_2$ in an amount of more than 50% of the total mass.

15. The polishing method according to claim 14, wherein components (A) and (B) are contained in a mass ratio of from 1:0.001 to 1:0.3.

16. A polishing method for a semiconductor substrate, which comprises polishing an insulating layer and/or a metal layer formed on a semiconductor substrate, with a cerium-containing abrasive comprising at least the following components (A) and (B):

(A) cerium-containing abrasive grains having an average particle size of from 0.5 to 5.0 µm; and (B) particles having an average particle size of from 0.01 to 0.3 µm, which are particles of aluminum oxide, the crystal form of which is α-alumina or γ-alumina.

17. The polishing method according to claim 14, wherein the abrasive is used as suspended in water in the form of a slurry.

18. The abrasive according to claim 1, wherein the abrasive grains containing $CeO_2$ are present in an amount of at least 60% of the total mass.

19. The abrasive according to claim 18, wherein the abrasive grains containing $CeO_2$ are present in an amount of at least 80% of the total mass.

20. The abrasive according to claim 19, wherein the abrasive grains containing $CeO_2$ are present in an amount of at least 98% of the total mass.

21. The abrasive according to claim 20, wherein the abrasive grains containing $CeO_2$ are present in an amount of at least 99.8% of the total mass.

22. The polishing method according to claim 9, wherein the abrasive grains containing $CeO_2$ are present in an amount of at least 60% of the total mass.

23. The polishing method according to claim 22, wherein the abrasive grains containing $CeO_2$ are present in an amount of at least 80% of the total mass.

24. The polishing method according to claim 23, wherein the abrasive grains containing $CeO_2$ are present in an amount of at least 98% of the total mass.

25. The polishing method according to claim 24, wherein the abrasive grains containing $CeO_2$ are present in an amount of at least 99.8% of the total mass.

26. The polishing method according to claim 14, wherein the abrasive grains containing $CeO_2$ are present in an amount of at least 60% of the total mass.

27. The polishing method according to claim 26, wherein the abrasive grains containing $CeO_2$ are present in an amount of at least 80% of the total mass.

28. The polishing method according to claim 27, wherein the abrasive grains containing $CeO_2$ are present in an amount of at least 98% of the total mass.

29. The polishing method according to claim 28, wherein the abrasive grains containing $CeO_2$ are present in an amount of at least 99.8% of the total mass.

30. An abrasive comprising at least the following components (A) and (B):

(A) cerium-containing abrasive grains having an average particle size of from 0.5 to 5.0 µm; and (B) particles having an average particle size of from 0.01 to 0.3 µm, which are particles of at least one member selected from the group consisting of aluminum oxide, zirconium oxide, titanium oxide, silicon nitride and manganese oxide.

31. A polishing method for a glass surface, which comprises polishing the glass surface with an abrasive comprising at least the following components (A) and (B):

(A) cerium-containing abrasive grains having an average particle size of from 0.5 to 5.0 µm; and (B) particles having an average particle size of from 0.01 to 0.3 µm, which are particles of at least one member selected from the group consisting of aluminum oxide, zirconium oxide, titanium oxide, silicon nitride and manganese oxide.

32. A polishing method for a semiconductor substrate, which comprises polishing an insulating layer and/or a metal layer formed on a semiconductor substrate, with a cerium-containing abrasive comprising at least the following components (A) and (B):

(A) cerium-containing abrasive grains having an average particle size of from 0.5 to 5.0 µm; and (B) particles having an average particle size of from 0.01 to 0.3 µm, which are particles of at least one member selected from the group consisting of aluminum oxide, zirconium oxide, titanium oxide, silicon nitride and manganese oxide.

* * * * *